United States Patent
Corbiere et al.

(10) Patent No.: US 8,476,981 B2
(45) Date of Patent: Jul. 2, 2013

(54) UNBALANCED/BALANCED CONVERSION DIFFERENTIAL AMPLIFIER

(75) Inventors: Remi Corbiere, Paris (FR); Bruno Louis, Saint Maur (FR); Vincent Petit, Bazainville (FR)

(73) Assignee: Thales, Neuilly sur Seine (FR)

( * ) Notice: Subject to any disclaimer, the term of this patent is extended or adjusted under 35 U.S.C. 154(b) by 0 days.

(21) Appl. No.: 13/315,814

(22) Filed: Dec. 9, 2011

(65) Prior Publication Data

US 2012/0313706 A1 Dec. 13, 2012

(30) Foreign Application Priority Data

Dec. 10, 2010 (FR) ...................................... 10 04820

(51) Int. Cl.
*H03F 3/04* (2006.01)

(52) U.S. Cl.
USPC .......................................... 330/301; 330/104

(58) Field of Classification Search
USPC ......................... 330/103, 104, 117, 301, 302
See application file for complete search history.

(56) References Cited

U.S. PATENT DOCUMENTS

| | | | |
|---|---|---|---|
| 6,121,809 A | 9/2000 | Ma et al. | |
| 7,205,844 B2 * | 4/2007 | Su et al. | 330/301 |
| 7,944,310 B2 * | 5/2011 | Chiu | 330/301 |
| 2002/0175763 A1 | 11/2002 | Dasgupta et al. | |
| 2009/0212872 A1 * | 8/2009 | Chang et al. | 330/301 |
| 2010/0052808 A1 | 3/2010 | Chiu | |

OTHER PUBLICATIONS

Shuenn-Yuh Lee et al.: "A 1-V Wideband Low-Power CMOS Active Differential Power Splitter for Wireless Communication," IEEE Transactions on Microwave Theory and Techniques, IEEE Service Center, Piscataway, NJ, US, vol. 55, No. 8, Aug. 1, 2008, pp. 1593-1600.
Xin Jie Wang et al.: "A Compensation Way for a Differential Pair to Achieve a High Performance Single-Ended to Differential Converter," Electrical and Computer Engineering, 2007. CCECE 2007. Canadian Conference on, IEEE, PI, Apr. 1, 2007, pp. 1137-1140.
Shou-Hsien Weng et al.: "A DC-21 GHz Low Imbalance Active Balun Using Darlington Cell Technique for High Speed Data Communications," IEEE Microwave and Wireless Components Letters, IEEE Service Center, New York, NY, US, vol. 19, No. 11, Nov. 1, 2009, pp. 728-730.
Search Report and Written Opinion of corresponding French Application No. 1004820, mailed on Jul. 28, 2011.

* cited by examiner

*Primary Examiner* — Khanh V Nguyen
(74) *Attorney, Agent, or Firm* — Baker Hostetler LLP

(57) ABSTRACT

A differential amplifier including an input of a balanced type relative to a reference potential; a balanced output; first and second bipolar transistors mounted in common emitter configuration, emitters of the first and second transistors linked by two feedback impedances in series; and a perfect current generator, wherein an impedance $Z_g$ at the terminals of the current generator is connected between a common point of the two feedback impedances and the reference potential, the input is connected to a base of the first transistor, a base of the second transistor is linked to the reference potential to form, with a base of the first transistor, the unbalanced input, the balanced output is produced by collectors of the first and second transistors through an impedance matching stage of the output, a correction feedback impedance $Z_{corr}$, wherein $Z_{corr}=2 \cdot Z_g$, connects the collector of the second transistor and the base of the first transistor.

4 Claims, 3 Drawing Sheets

UNBALANCED/BALANCED CONVERSION DIFFERENTIAL AMPLIFIER

CROSS-REFERENCE TO RELATED APPLICATION

This application claims priority to foreign French patent application No. FR 010 04820, filed on Dec. 10, 2010, the disclosure of which is incorporated by reference in its entirety.

FIELD OF THE DISCLOSED SUBJECT MATTER

The invention relates to a transistorized microwave differential amplifier for unbalanced/balanced conversion.

BACKGROUND

Embedded radar and electronic warfare equipment comprise microwave electronic devices such as fixed or variable gain low-noise amplifiers (LNA) and vector phase shifters.

These microwave devices usually have balanced microwave signal inputs and sometimes have to be connected to unbalanced signal ports, for example, as in the case of signals originating from a reception antenna that are conveyed and transmitted by an unbalanced coaxial line.

The unbalanced/balanced input conversion of reception microwave devices is usually implemented by an inductance-based passive coupling transformer called a BALUN, BALUN being a contraction of BALanced/UNbalanced.

Such a BALUN-type transformer at the input of a microwave device is accompanied by a significant increase in the footprint thereof at frequencies of a few GHz. Furthermore, the since the BALUN transformer is generally tuned to a predetermined frequency, it consequently operates in narrow band mode and limits the operating band of the microwave device with which it is associated. Furthermore, the noise factor of the receiver is degraded by the losses of the BALUN.

Other transistorized active-type solutions, to balance the signal input, are used in the microwave devices of the prior art. These solutions are based on GaAs (gallium arsenide) technology which offers the advantage of exhibiting very good intrinsic linearity and noise performance levels but, on the other hand, does have the drawback of a high fabrication cost with a low possibility of integration with its ancillary transistor control and biasing circuits. Consequently, these limitations are slowing down the possibility of miniaturizing such circuits. Furthermore, these drawbacks complicate the architecture of the microwave systems and penalize the cost of the equipment.

The use of SiGe (silicon-germanium) type technologies to implement microwave functions, techniques developed mainly for civil applications such as GPS (global positioning system), UMTS and WLAN, provide the benefit of a reduction in the cost of the integrated circuits including these microwave functions, allowing, among other things, for an integration of the interfaces and of the biasing functions for the transistors of the chip, the elimination of the negative potential power supplies, the reduction in consumption of the circuits, a high fabrication yield and good performance reproducibility.

FIG. 1 shows a schematic diagram of a basic differential conversion circuit of the prior art consisting of a differential pair of transistors T1, T2 in common emitter configuration. The emitters E of the two transistors T1, T2 are linked by two feedback impedances Ze in series. The biasing of the two transistors is provided by a perfect current Ig generator SC connected between the common point of the two feedback impedances Ze and the reference potential M. The perfect current generator SC comprises an impedance $Z_g$ between its two terminals to simulate a real current generator.

The voltage biasing of the transistors T1, T2 by the collectors C is performed by a device not represented in FIG. 1.

The collectors C of the two transistors T1, T2 are connected to a low-impedance load (not represented in FIG. 1) through a matching stage CHBP (10) of cascode circuit type with balanced outputs s1, s2.

The differential amplifier is dynamically driven in an unbalanced manner by a voltage v1 generator Ge between the base b1 of the transistor T1 and the reference potential M. The base b2 of the transistor T2 is set to the reference potential M.

The main drawback with this type of differential amplifier of the prior art is the degraded common mode rejection because of the impedance $Z_g$, which results in the imbalance between the collector currents as a function of the operating frequency F.

SUMMARY

To overcome the drawbacks of the differential devices of the prior art, the invention proposes an unbalanced/balanced conversion differential amplifier comprising a signal input v1 of unbalanced type relative to a reference potential and a signal of balanced type. The differential amplifier comprises two bipolar transistors T1, T2 mounted in common emitter configuration. The emitters E of the two transistors T1, T2 are linked by two feedback impedances in series. A perfect current Ig generator and an impedance $Z_g$ at the terminals of the current Ig generator are connected between the common point of the two feedback impedances and the reference potential. The signal input v1 is connected to the base of the transistor T1. The base of the transistor T2 is linked to the reference potential to form, with the base of the transistor T1, the unbalanced input. The balanced output is produced by the collectors of the two transistors T1, T2 through an impedance matching stage CHBP of the output.

A correction feedback impedance $Z_{corr}$ is connected between the collector of the transistor T2 and the base of the transistor T1 to balance the currents of the collectors of the two transistors T1, T2. The value of said correction feedback impedance $Z_{corr}$ is defined by:

$$Z_{corr} = 2 \cdot Z_g.$$

Advantageously, the two transistors T1, T2 are chosen to be either of PNP type or of NPN type.

In one embodiment, the matching stage CHBP is of impedance-lowering cascode type.

The invention also relates to an unbalanced/balanced conversion differential amplifier comprising a signal input v1 of unbalanced type relative to a reference potential and a signal output of balanced type. The differential amplifier comprises two MOSFET transistors T1, T2 in common source configuration. The sources of the two transistors are linked by two feedback impedances in series. A perfect current Ig generator and an impedance $Z_g$ at the terminals of the current Ig generator are connected between the common point of the two feedback impedances and the reference potential. The signal input v1 is connected to the gate of the transistor T1. The gate of the transistor T2 is linked to the reference potential to form, with the gate of the transistor T1, the unbalanced input. The balanced output is produced by the drains of the two transistors T1, T2 through an output impedance matching stage CHBP.

A correction feedback impedance $Z_{corr}$ is connected between the drain of the transistor T2 and the base of the transistor T1 to balance the currents of the drains of the two transistors T1, T2. The value of said correction feedback impedance $Z_{corr}$ is defined by:

$$Z_{corr} = 2 \cdot Z_g.$$

One main characteristic of the conversion differential amplifier according to the invention lies in the equalization of the collector currents of the transistor T1 and of the transistor T2 in the case of the bipolar transistors or the equalization of the drain currents in the case of MOSFET-type transistors.

A main aim of the amplifier according to the invention is to improve the common mode rejection and the bandwidth performance levels of the conversion differential amplifier.

Another aim is the reproducibility of the performance levels in series fabrication of the differential amplifier and a reduction in its fabrication cost.

BRIEF DESCRIPTION OF THE DRAWINGS

The invention will be better understood from the description of exemplary embodiments of unbalanced/balanced conversion differential amplifiers with reference to the indexed drawings in which.

DETAILED DESCRIPTION

Firstly, hereinafter in the description, the imbalance of the collector currents of the transistors is revealed in the differential amplifiers of the prior art. As has already been stated, this imbalance of the collector currents is responsible for the degraded performance levels of the differential pair comprising the two transistors T1 and T2.

Secondly, there is a description of the method and the implementation of an unbalanced/balanced conversion differential amplifier according to the invention that makes it possible to overcome, as a first approximation, this imbalance of the collector currents in order to restore the optimum performance levels of the differential pair.

Figure 1:
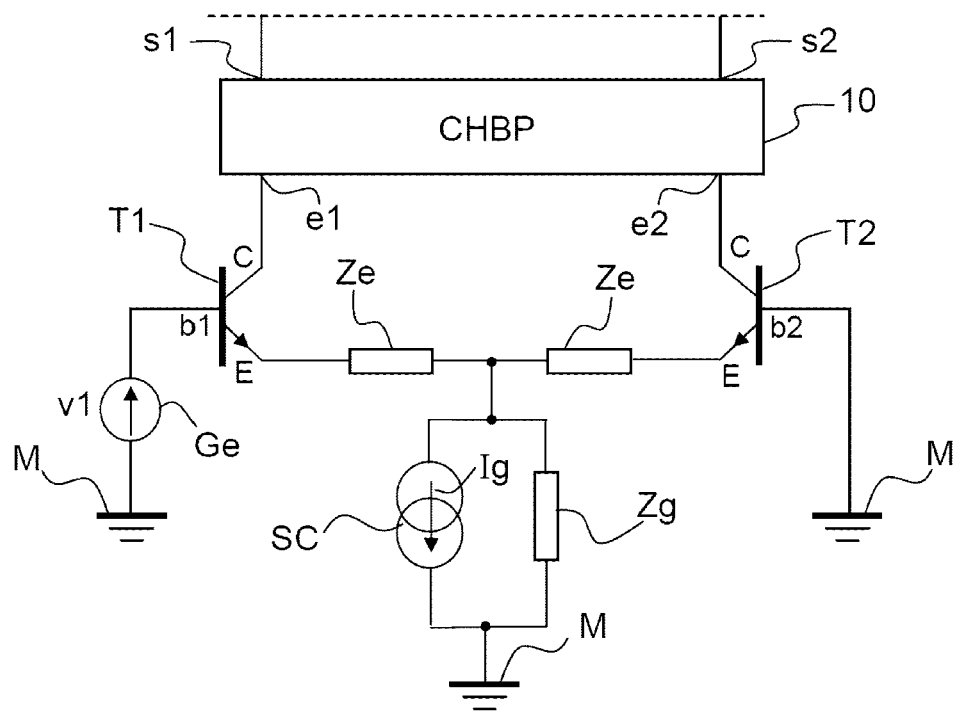
FIG. 1, already described, shows a schematic diagram of a basic differential conversion circuit of the prior art.
Figure 2:
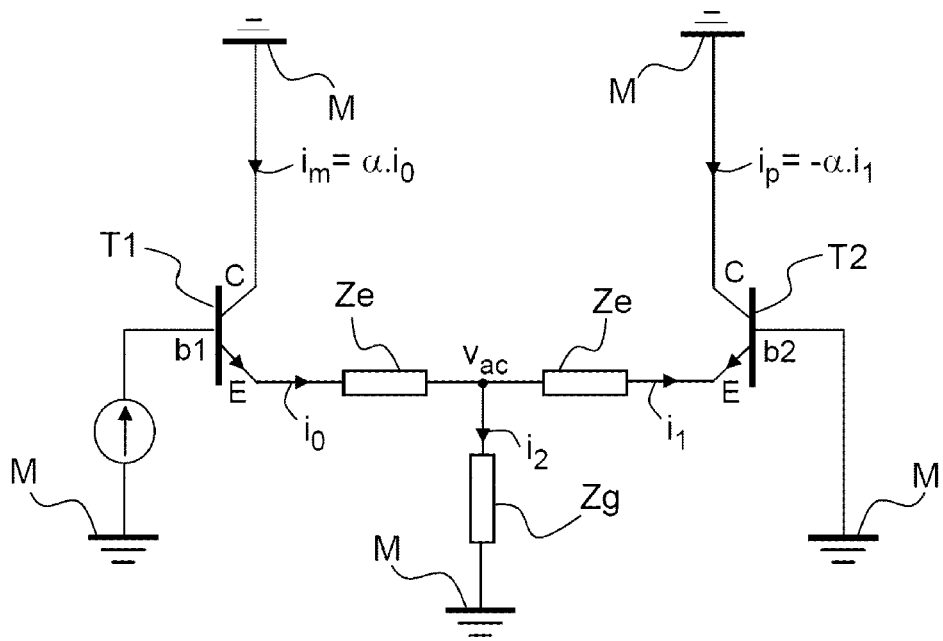
FIG. 2 shows an equivalent diagram of the circuit of FIG. 1 in operation with small signals.

FIG. 2 shows an equivalent diagram of the circuit of FIG. 1 in operation with small signals.

With small signals, the direct current DC voltage generators biasing the collectors of the transistors behave as short circuits setting the collectors C of the transistors to the reference potential M.

Referring to the equivalent diagram of FIG. 2, the currents in the collectors and in the emitters of the transistors T1, T2 are expressed by:

$$i_1 = i_0 - i_2$$

$$i_2 = \frac{v_{ac}}{Z_c} \text{ and } \alpha = \frac{\beta}{\beta + 1}$$

with:

$i_0$, small signal current from the emitter of transistor T1

$i_1$ small signal current from the emitter of transistor T2

$i_2$ small signal current in the impedance $Z_g$ of the current generator SC, $\alpha$ ratio between the emitter current and the collector current of the transistor, $\beta$ gain of the transistor, $v_{ac}$ at the terminals of the impedance $Z_g$ of the current generator SC.

The base-emitter control leg of the differential amplifier is reduced to the input impedance $h_{11e}$ of the transistor T1 with the small signals.

Referring to the differential amplifier of the prior art of FIGS. 1 and 2, it is possible to determine the Thévenin equivalent circuit between the bases b1, b2 of the transistors T1, T2 and to express therefrom the current $i_2$ flowing through the impedance $Z_g$ of the current generator SC, from the input impedance $h_{11e}$ of the transistor T1 and of the feedback Ze, $$i_2 = \frac{v1}{2} \cdot \frac{1}{\frac{h_{11e}}{2} + \frac{Ze}{2} + Zg}.$$

As a first approximation, if compared to $$Zg \quad \frac{h_{11e}}{2} \text{ and } \frac{Ze}{2}$$

are neglected, then the current in the impedance Zg of the current source becomes:

$$i_2 \cong \frac{v1}{2 \cdot Zg}.$$

The collector current $i_m$ of the transistor T1 and the collector current $i_p$ of the transistor T2 are therefore written:

$$i_m = \alpha \cdot i_0 \quad (3)$$

$$i_p = -\alpha \cdot i_1 =$$

$$-\alpha[i_0 - i_2] = -\alpha\left[i_0 - \frac{v1}{2 \cdot Zg}\right] = -\alpha \cdot i_0 + \alpha \cdot \frac{v1}{2 \cdot Zg} = i_m + \alpha \cdot \frac{v1}{2 \cdot Zg}$$

The expression (3) shows that the collector current $i_m$ of the transistor T1 is identical to the collector current $i_p$ of the transistor T2 to within the term $$\alpha \cdot \frac{v1}{2 \cdot Zg}.$$

It should be noted that the collector currents $i_m$ and $i_p$ are in phase opposition.

In the differential amplifiers of the prior art, efforts are made to maximize the impedance Zg of the current generator SC so as to make the term $$\alpha \cdot \frac{v1}{2 \cdot Zg}$$

tend toward a zero value and thus obtain a balance in the collector currents $i_m$ and $i_p$ of the differential pair T1, T2. However, the impedance Zg of the current generator SC cannot in practice have a very high value, notably because of the high working frequencies F of the order of a few GHz. In practice, it is an equivalent impedance of a current mirror which, at these working frequencies, exhibits a very low impedance to ensure a good balance in the collector currents of the two transistors T1, T2. Furthermore, this impedance Zg drops with the working frequency F.

Figure 3:
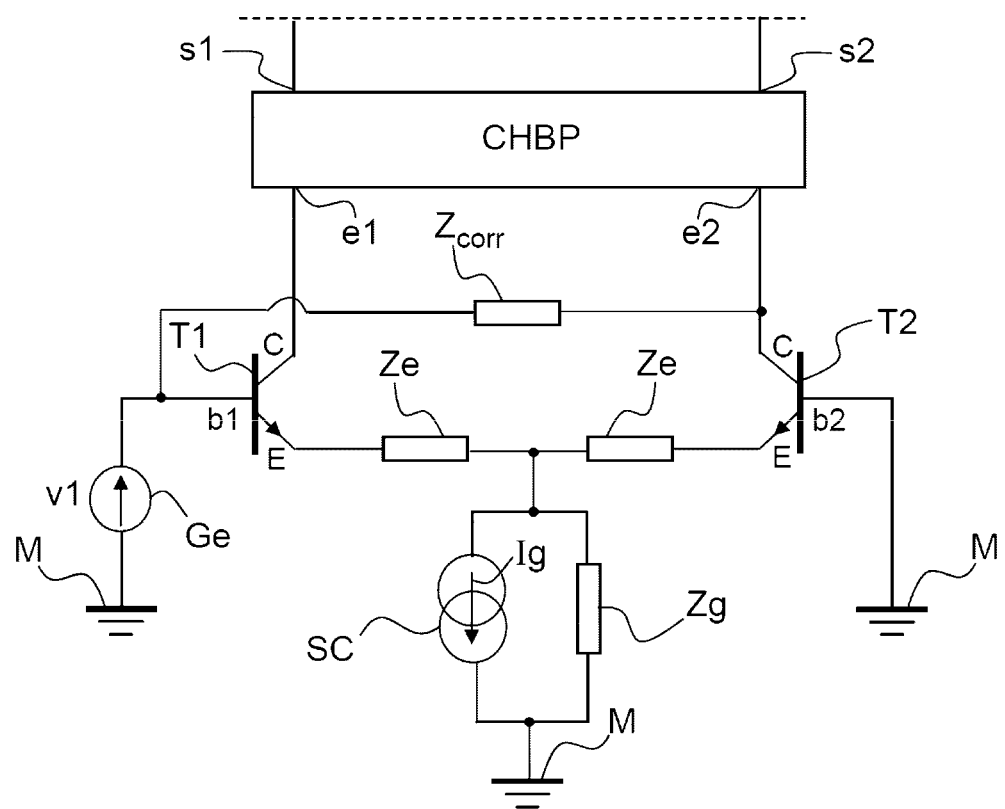
FIG. 3 shows an unbalanced/balanced conversion differential amplifier according to the invention.

FIG. 3 shows an unbalanced/balanced conversion differential amplifier as represented in FIG. 2 and comprising, in addition, according to a main feature of the invention, a feedback circuit to equalize the collector currents of the transistors. The feedback circuit is a correction feedback impedance Zcorr connected between the collector C of the transistor T2 and the base b1 of the transistor T1.

The principle used in the differential amplifier according to the invention, as represented in FIG. 3, consists in equalizing the collector currents $i_m$, $i_p$ of the two transistors T1, T2 by compensating for the term $$\alpha \cdot \frac{v1}{2 \cdot Zg}.$$

The collector currents $i_m''$ and $i_p''$ in the configuration of FIG. 3 with compensation are given by:

$$i_m'' = i_m = \alpha \cdot i_0$$

$$i_p'' = -i_m = -\alpha \cdot i_0 = \alpha \cdot i_0 + \alpha \cdot i_2 - \alpha \cdot i_2 = i_p - \alpha \cdot i_2 = i_p - \alpha \cdot \frac{v1}{2 \cdot Zg}$$

$i_m''$ being the current in the collector of T1
$i_p''$ being the current in the collector of T2.

This approach makes it possible to retain the current $i_m$ in the collector of T1 and the correction feedback circuit makes it possible to inject into the collector of the transistor T2 a correction current $i_{corr}$ such that:

$$i_{corr} = -\alpha \cdot i_2 = -\alpha \cdot \frac{v1}{2 \cdot Zg} \tag{4}$$

The term $$\frac{v1}{2 \cdot Zg}$$

represents a local feedback from the base b1 of the transistor T1 to the collector C of the transistor T2 to within the term a (a being very close to 1).

Thus, the correction current $i_{corr}$ is expressed as:

$$i_{corr} = -\frac{v1}{Zcorr} \tag{5}$$

Zcorr represents the correction feedback impedance.

Finally, by identification of the two expressions (4) and (5), the equality of the collector currents in the two transistors T1, T2 is obtained if, and only if, the correction feedback impedance Zcorr is twice the impedance Zg of the current generator SC:

$$Z_{corr} = 2 \cdot Z_g.$$

In order to validate the theoretical developments expressed previously, a series of simulations was carried out with a differential amplifier of the prior art showing the influence of the impedance Zg of the current generator on the balance of the currents in the collectors of the transistors T1 and T2.

Figure 4A:
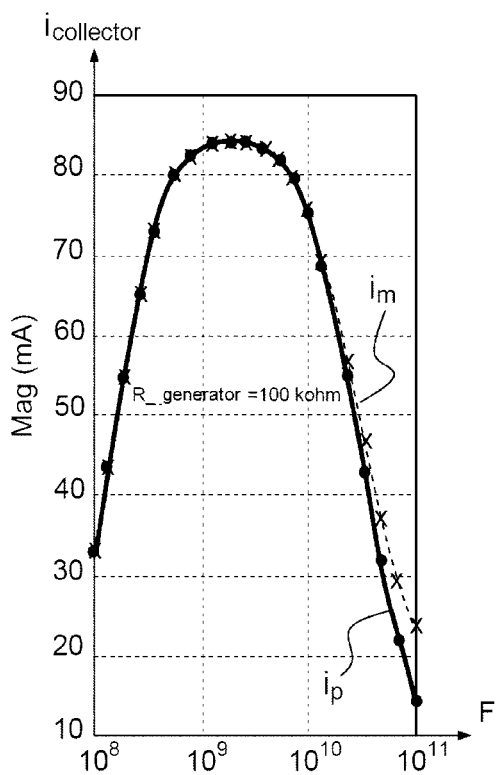
FIGS. 4a, 4b and 4c show collector currents $i_m$ and $i_p$ of the transistors of the differential amplifier of FIG. 2.
Figure 4B:
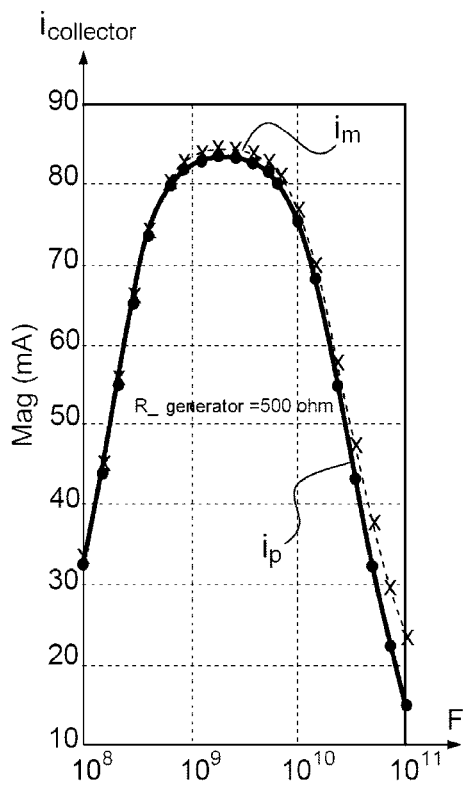

FIGS. 4a, 4b and 4b show the collector currents $i_m$ and $i_p$ of the transistors of the differential amplifier of FIG. 2, as a function of the impedance Zg of the current generator SC.

FIG. 4a shows the variation of the collector currents $i_m$ and $i_p$ as a function of the operating frequency F of the differential amplifier of the prior art, for an impedance Zg of the current generator of 100 kn. The superposition of the collector currents is observed up to a frequency F of 20 GHz. Beyond this, the capacitive effects of the transistors are felt notably on the transistor T2, which has the effect of reducing its current gain β. Thus, the term defining the ratio $$\frac{\beta}{\beta+1}$$

characterizing the probability of disappearance of an electron in the base of the transistor will be lower for T1 than for T2, consequently resulting in a collector current $i_p$ lower than the collector current $i_m$.

FIG. 4b shows the variation of the collector currents $i_m$ and $i_p$ as a function of the operating frequency F of the differential amplifier of the prior art for an impedance Zg of the current generator of 500Ω. The differences in the collector currents are identical to those of FIG. 4a at high frequency but the deviation is accentuated between 1 GHz and 20 GHz. The influence of the value of the impedance Zg of the current generator is thus directly more significant at the intermediate frequencies between 1 GHz and 20 GHz.

Figure 4C:
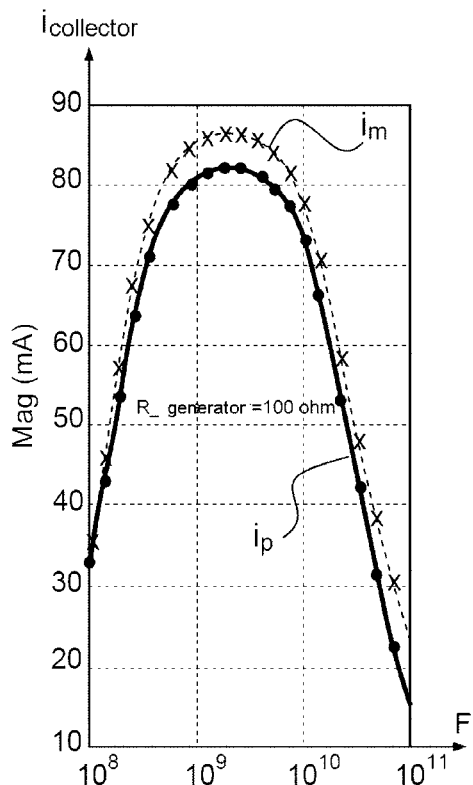

FIG. 4c shows the variations of the collector currents $i_m$ and $i_p$ as a function of the operating frequency F of the differential amplifier of the prior art for an even lower impedance Zg of the current generator of 100Ω. The deviation between the collector currents and therefore the degradation in the performance levels of the differential amplifier is all the more significant at the intermediate frequencies.

The correction feedback in the differential amplifier according to the invention makes it possible to compensate for a low impedance Zg of the order of 100Ω of the current generator SC which represents the order of magnitude of the equivalent impedance of a current mirror at these frequencies.

According to the invention, and to compensate for the deviation in the collector currents, a resistance $Z_{corr}=2\times 100Ω$, or 200Ω, is inserted between the base b1 of the transistor T1 and the collector C of the transistor T2.

Figure 5:
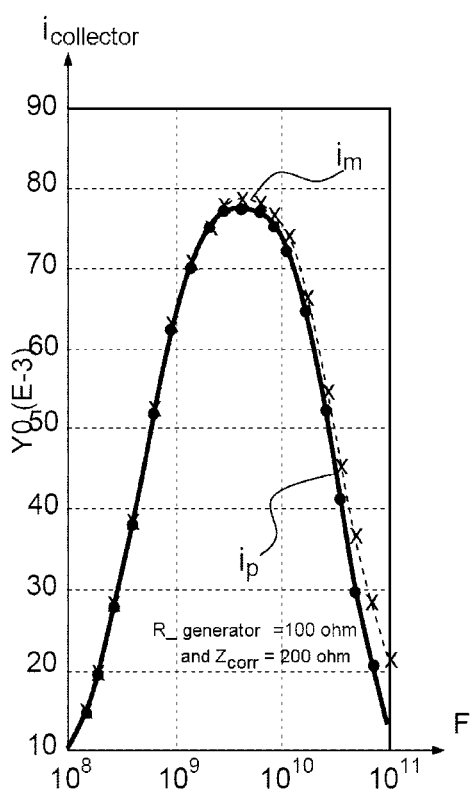
FIG. 5 shows the collector currents of the differential amplifier of FIG. 3.

FIG. 5 shows the collector currents of the differential amplifier, according to the invention, of FIG. 3 as a function of the working frequency F in the case of an impedance Zg=100Ω of the current generator SC. The collector currents $i_m$ and $i_p$ are almost merged together as a function of the working frequency F in comparison to the case of the collectors of the curves of FIG. 4c, without compensation of the impedance Zg of the current generator, which exhibit a great imbalance.

This result represented in FIG. 5 confirms the improved balance of the currents of the differential pair through compensation of the leakage current brought about by the low impedance of the current generator SC for biasing the differential amplifier.

The unbalanced/balanced conversion differential amplifier according to the invention is not limited to the bipolar transistors T1, T2. MOSFET-type transistors can also be used to produce the amplifier with correction feedback $Z_{corr}$. In the case of MOSFET transistors, the sources are connected to the current generator SC, the drains being the balanced outputs of the amplifier. The correction feedback by the resistance $Z_{corr}$ is then produced between the gate of the transistor T1 and the drain of the transistor T2.

The novel approach according to the invention therefore makes it possible to do away with the use of a passive-type conversion device such as the BALUN which is accompanied not only by a degradation in the performance levels of the differential structure but also a significant footprint.

We claim:

1. An unbalanced/balanced conversion differential amplifier comprising:
    a signal input of an unbalanced type relative to a reference potential;
    a signal output of a balanced type;
    first and second bipolar transistors mounted in a common emitter configuration, emitters of the first and second bipolar transistors being linked by two feedback impedances in series; and
    a perfect current generator, wherein
    an impedance $Z_g$ at the terminals of the perfect current generator is connected between a common point of the two feedback impedances and the reference potential,
    the signal input is connected to a base of the first bipolar transistor,
    a base of the second bipolar transistor is linked to the reference potential to form, with the base of the first bipolar transistor, the unbalanced signal input,
    the balanced signal output is produced by collectors of the first and second bipolar transistors through an impedance matching stage of the signal output, and
    a correction feedback impedance $Z_{corr}$ is connected between the collector of the second bipolar transistor and the base of the first bipolar transistor to balance the currents of the collectors of the first and second bipolar transistors, the value of said correction feedback impedance $Z_{corr}$ being defined by:

$$Z_{corr}=2 \cdot Zg.$$

2. The differential amplifier according to claim 1, wherein the first and second bipolar transistors are chosen to be either of a PNP type or of an NPN type.

3. An unbalanced/balanced conversion differential amplifier comprising:
    a signal input of an unbalanced type relative to a reference potential;
    a signal output of a balanced type;
    first and second MOSFET transistors in a common source configuration, the sources of the first and second MOSFET transistors being linked by two feedback impedances in series; and
    a perfect current generator, wherein
    an impedance $Z_g$ at the terminals of the perfect current generator is connected between a common point of the two feedback impedances and the reference potential,
    the signal input is connected to a gate of the first MOSFET transistor,
    a gate of the second MOSFET transistor is linked to the reference potential to form, with the gate of the first MOSFET transistor, the unbalanced signal input,
    the balanced signal output is produced by drains of the first and second MOSFET transistors through an impedance matching stage of the signal output, and
    a correction feedback impedance $Z_{corr}$ is connected between the drain of the second MOSFET transistor and the base of the first MOSFET transistor to balance the drain currents of the first and second MOSFET transistors, the value of said correction feedback impedance $Z_{corr}$ being defined by:

$$Z_{corr}=2 \cdot Zg.$$

4. The differential amplifier according to claim 3, wherein the impedance matching stage is of an impedance-lowering cascode type.

* * * * *